(12) United States Patent
Xu et al.

(10) Patent No.: US 9,362,212 B1
(45) Date of Patent: Jun. 7, 2016

(54) INTEGRATED CIRCUIT PACKAGE HAVING SIDE AND BOTTOM CONTACT PADS

(71) Applicant: FREESCALE SEMICONDUCTOR, INC., Austin, TX (US)

(72) Inventors: Yanbo Xu, Tianjin (CN); Jianshe Bi, Tianjin (CN); Jinsheng Wang, Tianjin (CN); Zhijie Wang, Tianjin (CN); Fei Zong, Tianjin (CN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/850,958

(22) Filed: Sep. 11, 2015

(30) Foreign Application Priority Data

Mar. 12, 2015 (CN) .......................... 2015 1 0226315

(51) Int. Cl.
*H01L 23/495* (2006.01)
*H01L 23/31* (2006.01)
*H01L 23/498* (2006.01)
*H01L 23/00* (2006.01)

(52) U.S. Cl.
CPC ........ *H01L 23/4952* (2013.01); *H01L 23/3121* (2013.01); *H01L 23/49537* (2013.01); *H01L 23/49555* (2013.01); *H01L 23/49811* (2013.01); *H01L 23/49838* (2013.01); *H01L 24/10* (2013.01); *H01L 24/42* (2013.01); *H01L 24/45* (2013.01); *H01L 24/85* (2013.01)

(58) Field of Classification Search
CPC ...................... H01L 23/4952; H01L 23/49811; H01L 23/49; H01L 24/42; H01L 23/49838; H01L 24/10; H01L 24/45
See application file for complete search history.

(56) References Cited

U.S. PATENT DOCUMENTS

| | | | |
|---|---|---|---|
| 6,277,672 | B1 | 8/2001 | Ho |
| 7,696,629 | B2 * | 4/2010 | Lin ..................... H01L 25/0657 257/777 |
| 7,872,335 | B2 | 1/2011 | Khan et al. |
| 8,154,134 | B2 | 4/2012 | Bonifield et al. |
| 8,951,840 | B2 * | 2/2015 | Qin ................... H01L 23/49582 257/777 |
| 2002/0079572 | A1 * | 6/2002 | Khan .................. H01L 23/3677 257/707 |
| 2010/0155929 | A1 * | 6/2010 | Lin ..................... H01L 25/0657 257/692 |
| 2012/0018892 | A1 * | 1/2012 | Soltan .................. H01L 23/481 257/773 |
| 2013/0082383 | A1 | 4/2013 | Aoya |
| 2013/0147043 | A1 | 6/2013 | Gonzalez et al. |

\* cited by examiner

*Primary Examiner* — Alonzo Chambliss
(74) *Attorney, Agent, or Firm* — Charles E. Bergere

(57) ABSTRACT

A packaged integrated circuit device includes a substrate module, leads, an IC die having first and second sets of die contact pads, and an encapsulant. The substrate module has upper and lower sets of conductive contacts on its upper and lower surfaces, respectively. The upper set of conductive contacts is electrically connected to the lower set of conductive contacts. The first set of die contact pads is electrically connected to the upper set of conductive contacts. The second set of die contact pads is electrically connected to the leads. Certain embodiments are a multi-form packaged device having both leads and conductive balls supporting different types of external connections, such as BGA and QFN.

17 Claims, 7 Drawing Sheets

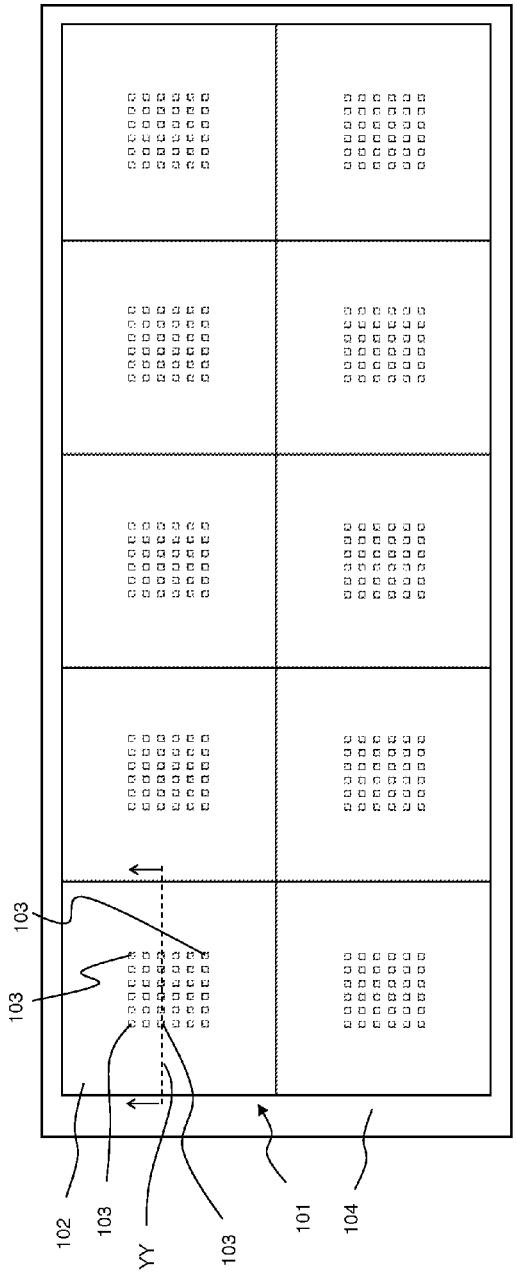
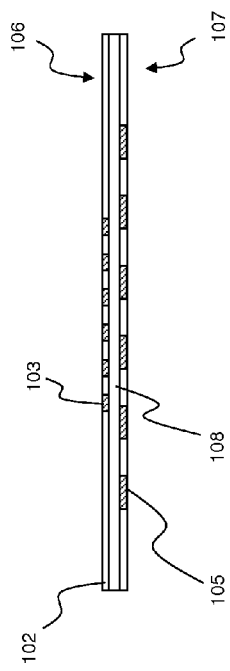
FIG. 1
FIG. 2

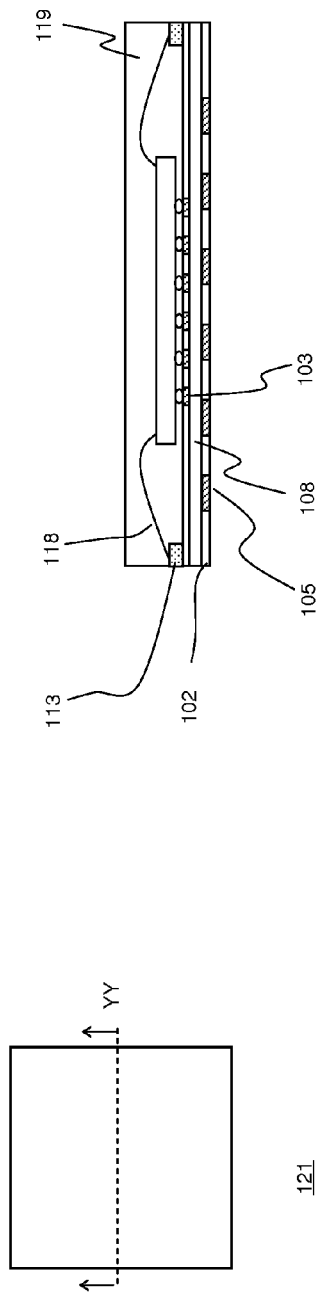
FIG. 11
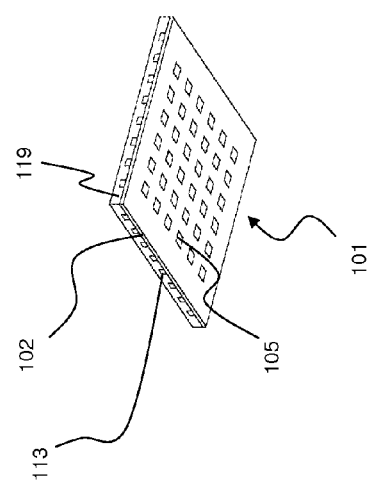
FIG. 12
FIG. 13

INTEGRATED CIRCUIT PACKAGE HAVING SIDE AND BOTTOM CONTACT PADS

BACKGROUND OF THE INVENTION

The present invention relates to integrated circuit (IC) packaging and, more particularly, to a multi-form IC package.

There are many conventional types of IC packages. Most conventional IC packages include at least (i) an IC die, (ii) a conductive interface for electrically connecting the die to other electronic components, such as, for example, a printed circuit board (PCB), and (iii) an encapsulant enclosing the die to protect the die and keep the die attached to the conductive interface. The conductive interface is either a lead frame or a substrate with conductive traces.

Conventional package types include, for example, dual in-line package (DIP), quad flat-pack (QFP), quad flat-pack no-lead (QFN), ball-grid array (BGA), and pin-grid array (PGA). The selection of a particular package type for a particular application depends on multiple factors. Some applications require a relatively large number of input/output (I/O) interconnects for the IC device. For some of those applications, increasing the density of I/O interconnects can increase the utility of a chip but at the expense of production cost. As used herein, the term "chip" refers to a packaged, singulated, IC device.

BRIEF DESCRIPTION OF THE DRAWINGS

Aspects, features, and advantages of the invention will become fully apparent from the following detailed description, the appended claims, and the accompanying drawings in which like reference numerals identify similar or identical elements. Note that elements in the figures are not drawn to scale.

FIG. 1 is a simplified top view of a substrate plate that comprises a two-dimensional array of substrate modules;

FIG. 2 is a simplified magnified cross-sectional side view of the substrate module of FIG. 1;

FIG. 11 is a simplified top view of the multi-form chip resulting from the singulation of the assemblage of FIG. 9;

FIG. 12 is a simplified enlarged cross-sectional side view of the multi-form chip of FIG. 11; and FIG. 13 is a perspective bottom view of the multi-form chip of FIG. 11.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, an IC die is packaged so that the conductive interface comprises both an array of contact pads on the bottom and leads on the side of the chip. One implementation may be considered a combination of a modified QFN and a BGA package.

FIGS. 1-13 illustrate steps in the assembly of an exemplary multi-form chip 121 of FIGS. 11, 12, and 13, in accordance with one embodiment of the invention. The assembly process includes lead frame stacking, die mounting, wire bonding, encapsulation, and singulation.

Figure 3:
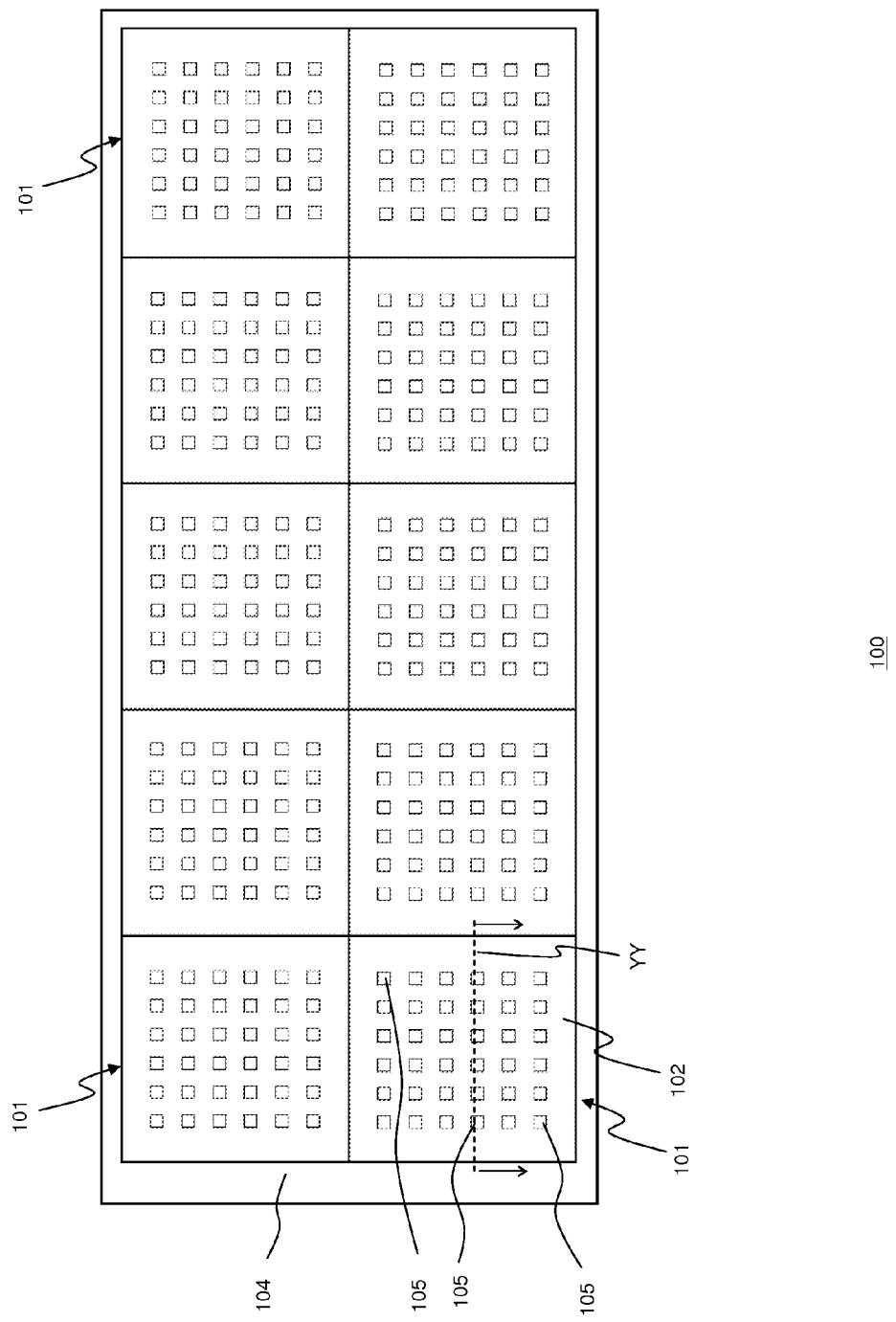
FIG. 3 is a simplified bottom view of the substrate plate of FIG. 1.

FIG. 1 is a simplified top view of a substrate plate 100, which comprises a two-dimensional array of ten substrate modules 101. FIG. 2 is a simplified magnified cross-sectional side view of one of the substrate modules 101 of FIG. 1 along the cut-line YY. The substrate module 101 of FIG. 2 is representative of all of the substrate modules 101. FIG. 3 is a simplified bottom view of the substrate plate 100 of FIG. 1. Each substrate module 101 comprises corresponding substrate material 102. The substrate plate 100 also comprises a substrate material periphery 104. Substrate materials 102 and 104 may be, for example, an epoxy-based material. The substrate plate 100 may be, for example, a conventional substrate plate designed for assembling BGA packages.

The substrate module 101 comprises corresponding substrate material 102. As shown in FIGS. 1 and 2, the substrate module 101 has a six-by-six array of thirty-six upper contact pads 103 on the top surface 106 of the substrate material 102. As shown in FIGS. 2 and 3, the substrate module 101 has a corresponding six-by-six array of thirty-six lower contact pads 105 on the bottom surface 107 of the substrate material 102.

The upper contact pads 103 are designed for the attachment of an IC die with conductive balls such as bonding balls or bonding bumps. The lower contact pads 105, which are a particular type of bottom-side conductive connectors, are for attachment to a PCB, or other component, using conductive balls. The upper contact pads 103 are smaller both individually and collectively, as an array than the lower contact pads 105. The pitch of the upper array is smaller than the pitch of the lower array. Interposed between the upper contact pads 103 and the lower contact pads 105 is a redistribution layer (RDL) 108, which connects each upper contact pad 103 to a corresponding lower contact pad 105. The redistribution layer 108 may comprise horizontal traces within and vertical vias through the substrate material 102. Note that FIG. 2, like the other corresponding cross-sectional side views, does not show the traces and vias of the redistribution layer 108.

Figure 4:
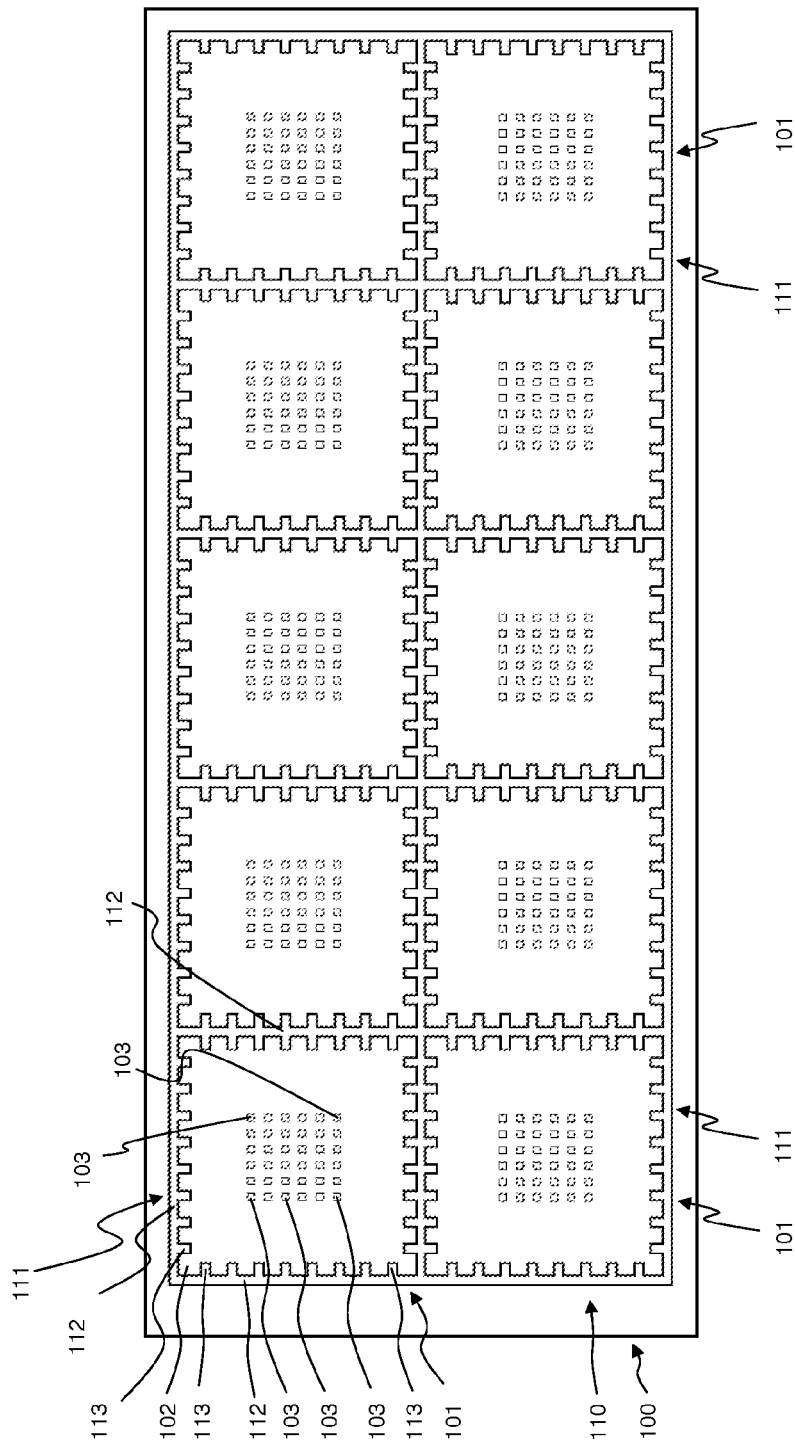
FIG. 4 is a simplified top view of an assemblage comprising the substrate plate of FIG. 1 and a lead frame array, following the attachment of the lead frame array to the top of the substrate plate.

FIG. 4 is a simplified top view of an assemblage 109 comprising the substrate plate 100 of FIG. 1 and a lead frame array 110, following the attachment of the lead frame array 110 to the top of the substrate plate 100. The lead frame array 110 is similar to a QFN lead frame modified to eliminate die pads and tie bars. The lead frame array 110 comprises ten lead frame modules 111 corresponding to the ten substrate modules 101. Each lead frame module 111 comprises four support bars 112. Note that the support bars 112 of adjoining lead frame modules 111 are shared.

Each lead frame module 111 supports thirty-two lead fingers 113, where each support bar 112 of each lead frame module 111 supports eight corresponding lead fingers 113.

Figure 5:
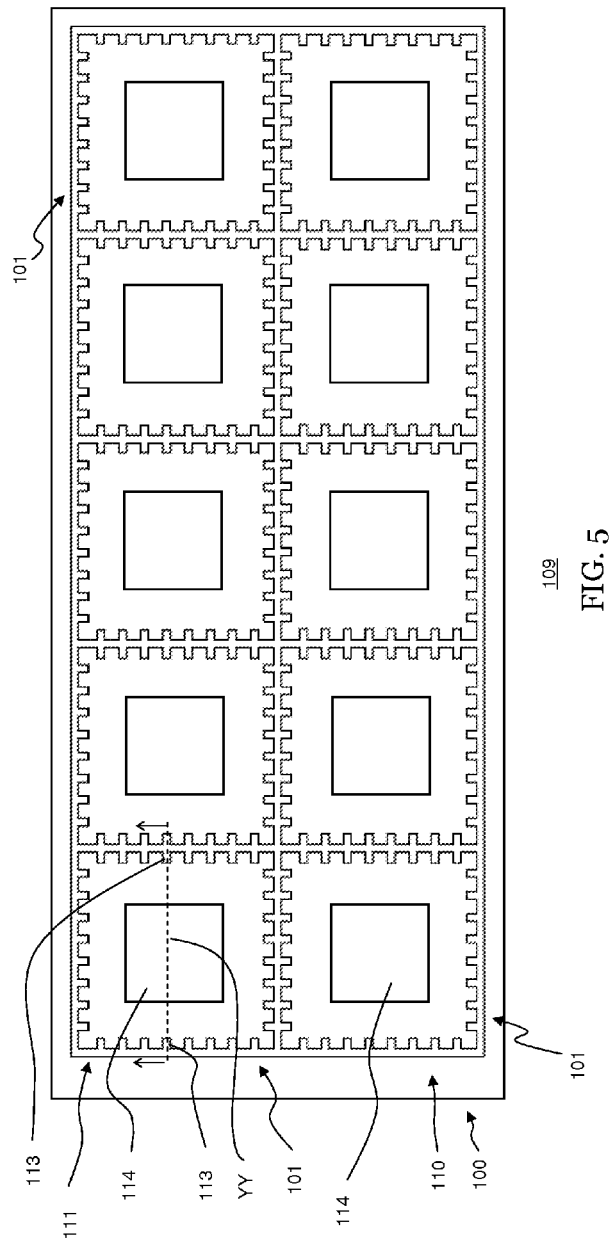
FIG. 5 is a simplified top view of the assemblage of FIG. 4 following the attachment of IC dies to the corresponding substrate modules.
Figure 6:
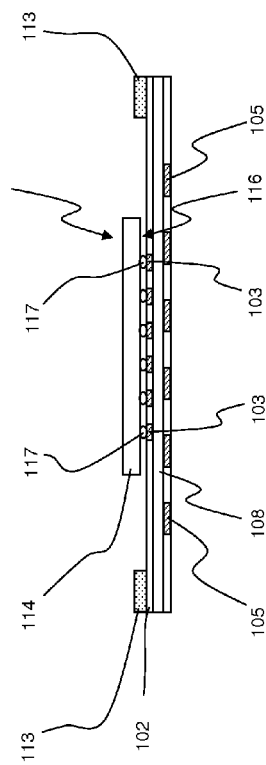
FIG. 6 is a simplified enlarged cross-sectional side view of the substrate module, the corresponding lead frame module, and one of the attached IC dies of FIG. 5.

FIG. 5 is a simplified top view of the assemblage 109 of FIG. 4 following the attachment of ten IC dies 114 to the corresponding ten substrate modules 101. FIG. 6 is a simplified enlarged cross-sectional side view of one of the substrate modules 101, the corresponding lead frame module 111, and the corresponding attached IC die 114 of FIG. 5 along the cut-line YY.

The IC die 114 is electrically connected and attached to the upper contact pads 103 of the substrate module 101 using thirty-six corresponding conductive balls 117. In addition to the conductive balls 117, the IC die 114 may be additionally attached to the substrate module 101 using underfill (not shown) interposed between the IC die 114 and the substrate material 102 of the substrate module 101.

The IC die 114 is a through-silicon-via (TSV) die having its active layer (not shown)—i.e., the layer with the active devices—at the die top 115. The IC die 114 has vias (not shown) connecting the active layer at the die top 115 to the die-bottom contact pads (not shown) at the die bottom 116. The die-bottom contact pads of the IC die 114 connect to the corresponding upper contact pads 103 with the corresponding conductive balls 117. The IC die 114 additionally has bond pads (not shown) on the die top 115, which may be used to electrically connect, e.g., with bond wires, the IC die 114 to the corresponding lead frame module 111.

Figure 7:
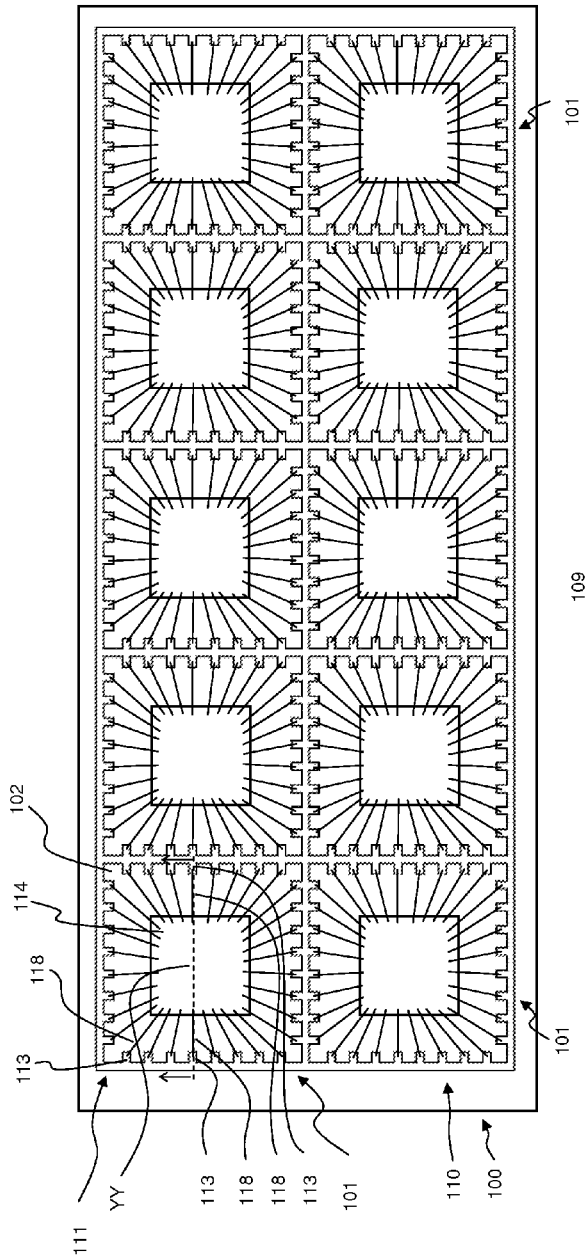
FIG. 7 is a simplified top view of the assemblage of FIG. 5 following the electrical connection—using bond wires—of the IC dies to the corresponding lead frame modules.

FIG. 7 is a simplified top view of the assemblage 109 of FIG. 5 following the electrical connection using bond wires 118 of the IC dies 114 to the corresponding lead frame modules 111.

Figure 8:
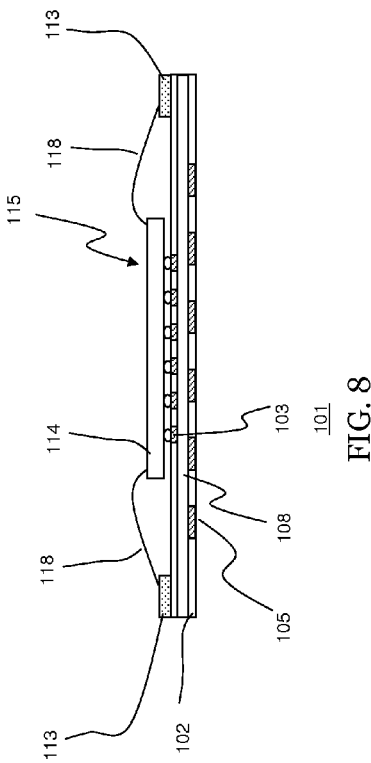
FIG. 8 is a simplified enlarged cross-sectional side view of the substrate module, the corresponding lead frame module, one of the attached IC dies, and the corresponding bond wires of FIG. 7.

FIG. 8 is a simplified enlarged cross-sectional side view of the substrate module 101, the corresponding lead frame module 111, the corresponding attached IC die 114, and the corresponding bond wires 118 of FIG. 7 along the cut-line YY. The bond pads on the die top 115 of the IC die 114 are electrically connected to corresponding lead fingers 113 using corresponding bond wires 118.

Figure 9:
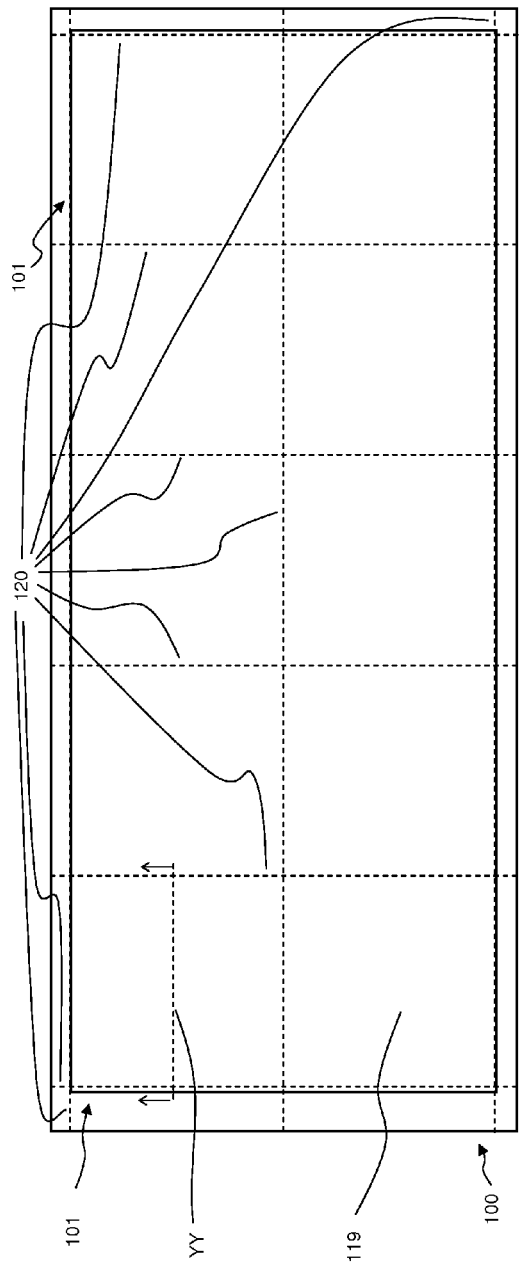
FIG. 9 is a simplified top view of the assemblage of FIG. 7 following encapsulation with an encapsulant.
Figure 10:
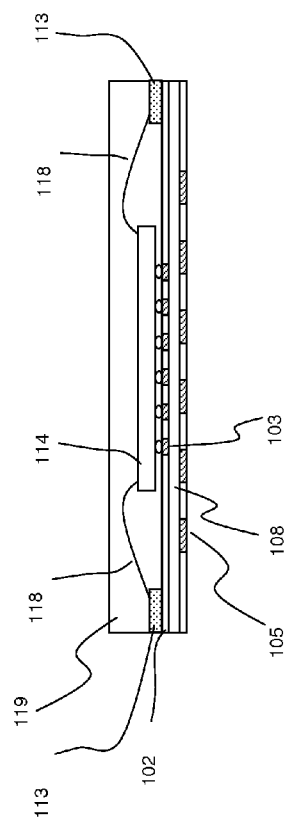
FIG. 10 is a simplified enlarged cross-sectional side view of the substrate module, the corresponding lead frame module, one of the attached IC dies, the corresponding bond wires, and the corresponding encapsulant of FIG. 9.

FIG. 9 is a simplified top view of the assemblage 109 of FIG. 7 following encapsulation with an encapsulant 119. FIG. 10 is a simplified enlarged cross-sectional side view of the substrate module 101, the corresponding lead frame module 111, the corresponding attached IC die 114, the corresponding bond wires 118, and the corresponding encapsulant 119 of FIG. 9 along the cut-line YY.

Following encapsulation, the assemblage 109 undergoes a singulation, also called dicing, step in which the substrate modules 101 are singulated, i.e., separated from each other, by cutting along the cutting-lines 120. The singulation may be accomplished using a laser (not shown) or a circular saw (not shown), in which case the cutting-lines 120 may be said to represent saw streets for the circular-saw cutting. The singulation involves removing the distal portions of (i) the lead fingers 113—which leaves behind corresponding leads 113, (ii) the encapsulant 119, and (iii) the substrate material 102 of each substrate module 101 to end up with the corresponding multi-form chips 121.

FIG. 11 is a simplified top view of one of the multi-form chips 121 resulting from the singulation of the corresponding substrate module 101 of the assemblage 109 of FIG. 9. FIG. 12 is a simplified enlarged cross-sectional side view of the multi-form chip 121 of FIG. 11. FIG. 13 is a perspective bottom view of the multi-form chip 121 of FIG. 11. The multi-form chip 121 is ready for attachment to a corresponding PCB using both the lower contact pads 105—which may be connected to the PCB using conductive balls—and the leads 113—which may be connected to the PCB using conductive bumps or soldering. The use of both the lower contact pads 105 and the leads 113 allows the multi-form chip 121 to have a higher density of input/output nodes than may be available by using only lower contact pads or only leads.

An embodiment of the invention has been described where a substrate module comprises a six-by-six array of upper contact pads, a corresponding six-by-six array of lower contact pads, and a redistribution layer interposed therebetween that connects each upper contact pad to the corresponding lower contact pad. The invention is not, however, so limited. Alternative implementations may have a different number of upper contact pads that may be arranged in any suitable manner. Alternative implementations may have a different number of lower contact pads that may be arranged in any suitable manner. Alternative implementations may have redistribution layers that may connect any number of upper contact pads to any number of lower contact pads in any suitable pattern.

An embodiment of the invention has been described where a substrate plate comprises substrate modules and a substrate material periphery. The invention is not, however, so limited. In some alternative embodiments, the substrate plate includes one or more substrate modules but does not include a substrate material periphery.

An embodiment of the invention has been described where the upper contact pads of the substrate module are individually smaller and have an array with a smaller pitch than the lower contact pads. The invention is not, however, so limited. In some alternative embodiments, the upper contact pads are the same size as, or larger than, the lower contact pads. In some alternative embodiments, the array of the upper contact pads has a pitch that is the same as or larger than that of the array of the lower contact pads.

An embodiment of the invention has been described where the upper contact pads of a substrate module are electrically connected to corresponding lower contact pads by a redistribution layer. The invention is not, however, so limited. In alternative embodiments, the upper contact pads are electrically connected to corresponding lower contact pads using vertical vias through the substrate material without an intervening redistribution layer.

An embodiment of the invention has been described where the lower contact pads are bond pads for ball-bond attachment. The invention is not, however, so limited. Alternative implementations of the substrate module may instead have other types of bottom-side conductive connectors such as, without limitation, (i) pins for a corresponding socket or (ii) openings for corresponding pins on a corresponding receptacle.

An embodiment of the invention has been described where the tops of the upper contact pads are flush with the top surface of the corresponding substrate material and the bottoms of the lower contact pads are flush with the bottom surface of the corresponding substrate material. The invention is not, however, so limited. Alternative implementations may have upper and/or lower contacts pads that are recessed within or extend out of the corresponding substrate material.

An embodiment of the invention has been described where the IC die is a TSV die that is electrically connected to the lower contact pads by die-bottom contact pads connected to upper contact pads of the substrate module with conductive balls. The invention is not, however, so limited. In some alternative embodiments, die-top bond pads at the top of the IC die are wire-bonded to upper contact pads of the substrate module—as well as to lead fingers of the corresponding lead frame.

An embodiment of the invention has been described where the active layer of the IC die is at the die top. The invention is not, however, so limited. In some alternative embodiments, the active layer of the IC die is at the die bottom, where the IC die is used as a flip-chip die. In these alternative embodiments, through-silicon vias are used to connect the active layer at the die bottom to the die-top contact pads of the IC die, which are used for wire bonding to the corresponding lead frame.

An embodiment of the invention has been described where the IC dies are connected and attached to the substrate plate after the lead frame array is attached to the substrate plate. The invention is not, however, so limited. In alternative embodiments, the IC dies are connected and attached to the substrate plate before the lead frame array is attached.

An embodiment of the invention has been described where a modified QFN lead frame is used to assemble the multi-form chips. The invention is not, however, so limited. In alternative embodiments, other types of lead frames are used. In one alternative embodiment, the lead frame used is a modified quad flat pack (QFP) lead frame that is modified to have no die pad or tie bars. The modified QFP lead frame comprises lead fingers supported by support bars and dam bars located proximally to the support bars. During encapsulation, the substrate module is encapsulated up to the dam bars, which leaves the distal portions of the lead fingers exposed and not encapsulated. During singulation, the support bars are removed and the dam bars are cut to electrically isolate the individual leads from each other. After singulation, the resultant multi-form chip has lower contact pads on the bottom surface and protruding leads on the sides. The protruding leads may be bent into, for example, gull-wing leads or j leads. If the protruding leads are bent into j leads, then the encapsulant may be provided with corresponding notches in which the j leads are recessed.

Embodiments of the invention have been described where the multi-form chips are square in a top view. The invention is now, however, so limited. In alternative embodiments, the multi-form chips have, in a top view, shapes other than a square.

Embodiments of the invention have been described where the mutli-form chips have leads on four sides of the chip. The invention is not, however, so limited. In alternative embodiments, the multi-form chips have leads on fewer or more than four sides.

Embodiments of the invention have been described where a multi-form chip includes one IC die. The invention is not, however, so limited. In some embodiments, the multi-form chip includes two or more IC dies, which may be, for example, stacked vertically or placed side by side.

It should be noted that—unless mutually exclusive—any of the above alternatives may be combined with any other alternative embodiments and/or the above-described embodiment.

It will be further understood that various changes in the details, materials, and arrangements of the parts which have been described and illustrated in order to explain the nature of this invention may be made by those skilled in the art without departing from the scope of the invention as expressed in the following claims.

A lead frame is a collection of metal leads and possibly other elements (e.g., die paddles, power bars) that is used in semiconductor packaging for assembling one or more IC dies into a single packaged semiconductor device. Prior to assembly into a packaged device, a lead frame may have support structures (e.g., a rectangular metal frame) that keep those elements in place. During the assembly process, the support structures may be removed. As used herein, the term "lead frame" may be used to refer to the collection of elements before assembly or after assembly, regardless of the presence or absence of those support structures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A packaged integrated circuit (IC) device, comprising:
   a substrate module comprising:
      an upper set of conductive contacts on an upper surface of the substrate module; and
      a lower set of conductive contacts on a lower surface of the substrate module;
   a plurality of leads; and
   an IC die comprising a first set of die contact pads and a second set of die contact pads, wherein:
      at least one of the upper set of conductive contacts is electrically connected to at least one of the lower set of conductive contacts;

at least one of the first set of die contact pads is electrically connected to at least one of the upper set of conductive contacts; and at least one of the second set of die contact pads is electrically connected to at least one of the plurality of leads.

2. The IC device of claim 1, further comprising an encapsulant that covers at least a part of the IC die, at least part of the upper surface of the substrate module, and at least part of the plurality of leads.

3. The IC device of claim 2, wherein:
the IC device has a top, a bottom, and a plurality of side surfaces;
the lower surface of the substrate module forms at least part of the bottom of the IC device;
the upper surface of the encapsulant forms at least part of the top of the IC device; and
the encapsulant, the substrate module, and exposed conductive surfaces of the plurality of leads form at least part of the side surfaces of the IC device.

4. The IC device of claim 3, wherein the exposed conductive surfaces of the plurality of leads are flush with the encapsulant at the side surfaces of the IC device.

5. The IC device of claim 3, wherein the exposed conductive surfaces of the plurality of leads are one of (i) gull-wing leads and (ii) j leads.

6. The IC device of claim 2, wherein:
one or more of the second set of die contact pads is electrically connected to one or more of the plurality of leads with one or more corresponding bond wires; and
the encapsulant covers the bond wires.

7. The IC device of claim 1, wherein:
the substrate module comprises a redistribution layer interposed between the upper and lower sets of conductive contacts; and
the redistribution layer connects each contact pad of the upper set of conductive contacts to one or more corresponding contact pads of the lower set of conductive contacts.

8. The IC device of claim 1, wherein the substrate module includes a set of vias that connect each contact pad of the upper set of conductive contacts to a corresponding contact pad of the lower set of conductive contacts.

9. The IC device of claim 1, wherein the lower set of conductive contacts comprises one of (i) bond pads for conductive-ball attachment, (ii) pins for a corresponding socket, and (iii) openings for corresponding pins on a corresponding receptacle.

10. The IC device of claim 1, wherein:
the first set of die contact pads is located on a bottom side of the IC die; and
the IC die has a plurality of through-silicon-vias (TSVs) for connecting components on a top side of the IC die the first set of die contact pads.

11. The IC device of claim 1, wherein:
the first set of die contact pads is electrically connected to the upper set of conductive contacts using conductive balls; and the second set of die contact pads is electrically connected to the plurality of leads with bond wires.

12. A method for assembling one or more packaged integrated circuit (IC) devices, the method comprising:
attaching a lead frame array of lead frame modules to a substrate plate comprising an array of substrate modules, wherein:
each lead frame module comprises a plurality of leads;
each lead frame module corresponds to one of the substrate modules;
each substrate module comprises:
an upper set of conductive contacts on an upper surface of the substrate module; and
a lower set of conductive contacts on a lower surface of the substrate module; and
attaching a corresponding IC die to each substrate module, wherein, for each corresponding IC die:
the IC die has a first set of die contact pads and a second set of die contact pads;
at least one of the upper set of conductive contacts is electrically connected to at least one of the lower set of conductive contacts;
at least one of the first set of die contact pads is electrically connected to at least one of the upper set of conductive contacts; and
at least one of the second set of die contact pads is electrically connected to at least one of the plurality of leads.

13. The method of claim 12, wherein one or more of the first set of die contact pads is electrically connected to one or more of the upper set of conductive contacts using one or more conductive balls.

14. The method of claim 12, wherein one or more of the second set of die contact pads is electrically connected to one or more of the plurality of leads using one or more bond wires.

15. The method of claim 12, further comprising encapsulating, for each substrate module and corresponding lead frame module, at least a part of the IC die, at least part of the upper surface of the substrate module, and at least part of the plurality of leads with an encapsulant.

16. The method of claim 15, further comprising singulation of the encapsulated substrate plate into a plurality of IC devices corresponding to the substrate modules, wherein, for each IC device:
the IC device has a top, a bottom, and a plurality of side surfaces;
the lower surface of the substrate module forms part of the bottom of the IC device;
the upper surface of the encapsulant forms part of the top of the IC device; and
the encapsulant, the substrate module, and exposed conductive surfaces of the plurality of leads form part of the side surfaces of the IC device.

17. The method of claim 12, further comprising attaching the IC device to a printed circuit board using conductive balls corresponding to the lower set of conductive contacts and conductive connectors corresponding to the plurality of leads.

* * * * *